(12) United States Patent
Wood et al.

(10) Patent No.: US 6,881,974 B2
(45) Date of Patent: Apr. 19, 2005

(54) PROBE CARD FOR TESTING MICROELECTRONIC COMPONENTS

(75) Inventors: Alan G. Wood, Boise, ID (US); Trung T. Doan, Boise, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/730,548

(22) Filed: Dec. 8, 2003

(65) Prior Publication Data

US 2004/0113644 A1 Jun. 17, 2004

Related U.S. Application Data

(62) Division of application No. 10/230,653, filed on Aug. 29, 2002, now Pat. No. 6,773,938.

(51) Int. Cl.$^7$ .......................... H01L 23/58; G01R 31/02
(52) U.S. Cl. .................. 257/48; 257/774; 324/437; 324/757; 324/758
(58) Field of Search .................. 257/48, 734, 773, 257/774, 786; 324/71.1, 71.5, 72, 72.5, 437, 425, 426, 439, 445, 446, 500, 537, 600, 649, 691, 722, 724, 754, 757, 758, 761, 762, 765

(56) References Cited

U.S. PATENT DOCUMENTS

| | | | |
|---|---|---|---|
| 5,447,264 A | 9/1995 | Koopman et al. | 228/56.3 |
| 5,739,050 A | 4/1998 | Farnworth | 438/15 |
| 5,815,000 A | 9/1998 | Farnworth et al. | 324/755 |
| 5,894,218 A | 4/1999 | Farnworth et al. | 324/158.1 |
| 6,018,249 A | 1/2000 | Akram et al. | 324/758 |
| 6,025,728 A | 2/2000 | Hembree et al. | 324/755 |
| 6,072,323 A | 6/2000 | Hembree et al. | 324/755 |
| 6,078,186 A | 6/2000 | Hembree et al. | 324/755 |
| 6,081,429 A | 6/2000 | Barrett | 361/767 |
| 6,094,058 A | 7/2000 | Hembree et al. | 324/755 |
| 6,107,122 A | 8/2000 | Wood et al. | 438/117 |
| 6,150,717 A | 11/2000 | Wood et al. | 257/738 |
| 6,163,956 A | 12/2000 | Corisis | 29/832 |
| 6,188,232 B1 | 2/2001 | Akram et al. | 324/755 |
| 6,198,172 B1 | 3/2001 | King et al. | 257/797 |
| 6,208,156 B1 | 3/2001 | Hembree | 324/755 |
| 6,247,629 B1 | 6/2001 | Jacobson et al. | 228/4.5 |

(Continued)

FOREIGN PATENT DOCUMENTS

| | | |
|---|---|---|
| JP | 200321302 A | 11/2000 |
| WO | WO 01/67116 A2 | 9/2001 |

OTHER PUBLICATIONS

Schott Corporation, Technical Glass Division, "FOTURAN® photo–etchable glass," 2 pages, 2002, retrieved from the Internet on Dec. 5, 2002, <http://www.us.schott.com/tgd/english/products/foturan.html>.

Advanced Coating, "What is Parylene?" 3 pages, 2000, retrieved from the Internet on Dec. 5, 2002; <http://www.coformal-coating.com/parylene_coating.htm>.

*Primary Examiner*—Alonzo Chambliss
(74) *Attorney, Agent, or Firm*—Perkins Coie LLP

(57) ABSTRACT

Various aspects of the invention provide methods of manufacturing probe cards and test systems which may test microelectronic components using such probe cards. In one specific example, a probe card may be manufactured by forming a plurality of blind holes in a substrate, with each hole having a closed bottom spaced from a back of the substrate by a back thickness. An electrically conductive metal may be deposited on the substrate to fill the holes and define an overburden on the substrate. The metal in each hole may define a conductor. At least a portion of the overburden may be removed to electrically isolate each of the conductors from one another. A portion of the substrate including the back thickness is removed to define an array of pins extending outwardly from a remaining thickness of the substrate, with each pin being an exposed length of one of the conductors.

19 Claims, 8 Drawing Sheets

U.S. PATENT DOCUMENTS

| | | | |
|---|---|---|---|
| 6,255,833 B1 | 7/2001 | Akram et al. | 324/755 |
| 6,285,204 B1 | 9/2001 | Farnworth | 324/757 |
| 6,294,839 B1 | 9/2001 | Mess et al. | 257/777 |
| 6,343,940 B1 * | 2/2002 | Khoury et al. | 439/66 |
| 6,356,098 B1 | 3/2002 | Akram et al. | 324/765 |
| 6,504,223 B1 * | 1/2003 | Zhou et al. | 257/503 |
| 6,566,898 B1 | 5/2003 | Thiessen et al. | 324/754 |
| 6,586,955 B1 | 7/2003 | Fjelstad et al. | 324/754 |
| 6,677,245 B1 * | 1/2004 | Zhou et al. | 438/708 |
| 6,773,938 B1 * | 8/2004 | Wood et al. | 438/15 |
| 2003/0003724 A1 | 1/2003 | Uchiyama et al. | 438/667 |
| 2003/0010976 A1 | 1/2003 | Grube et al. | 257/48 |

\* cited by examiner

PROBE CARD FOR TESTING MICROELECTRONIC COMPONENTS

CROSS-REFERENCE TO RELATED APPLICATION

This application is a divisional application of U.S. patent application Ser. No. 10/230,653, entitled "PROBE CARD, E.G., FOR TESTING MICROELECTRONIC COMPONENTS, AND METHODS FOR MAKING SAME", filed Aug. 29, 2002, now U.S. Pat. No. 6,773,938, which is incorporated herein by reference in its entirety.

BACKGROUND

The present invention provides certain improvements in microelectronic component testing. More particularly, the present invention provides probe cards of the type which may be used in testing microelectronic components. These probe cards are not limited to microelectronic component testing, though, and have utility in a variety of other applications, as well.

The microelectronics industry is highly competitive and most microelectronics manufacturers are highly sensitive to quality and cost considerations. Most microelectronics manufacturers require that suppliers of microelectronic components test performance of each microelectronic component before shipment to minimize the manufacturer's product losses. Microelectronics are commonly tested by establishing temporary electrical connections between a test system and electrical contacts on the microelectronic component.

One way of establishing a temporary electrical connection between the test system and the contacts on the microelectronic component employs a probe card carrying a plurality of probe pins. The probe pins are typically either a length of wire or a relatively complex spring-biased mechanism, e.g., POGO PINS, commercially available from Pogo Industries of Kansas City, Kans., USA. The probe pins are individually formed then inserted in a pin mounting plate in which an array of holes has been precisely machined. This is a fairly laborious, expensive process. The process becomes even more complex as microelectronic components move to progressively finer contact pitches, which require the probe pins to be spaced closer and closer to one another.

DETAILED DESCRIPTION

A. Overview

Figure 1:
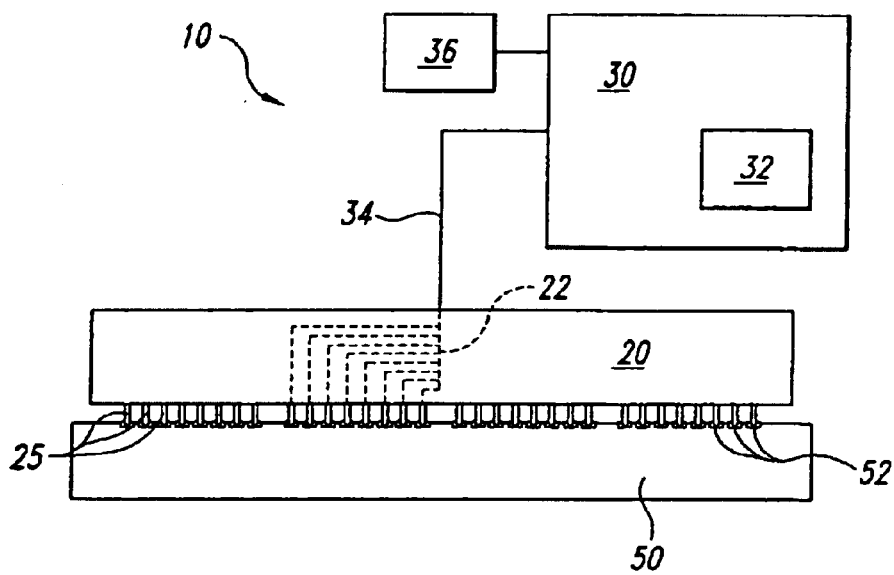
FIG. 1 is a schematic overview of a microelectronic component test system in accordance with an embodiment of the invention.

Various embodiments of the present invention provide probe cards useful in testing microelectronic components and methods for manufacturing such probe cards. The terms "microelectronic component" and "microelectronic component assembly" may encompass a variety of articles of manufacture, including one or more memory modules (e.g., SIMM, DIMM, DRAM, flash-memory), ASICs, processors, semiconductor wafers, semiconductor dies singulated from such wafers, or any of a variety of other types of microelectronic devices or components therefor. The term "probe card" may encompass a variety of architectures, including both rigid structures and flexible structures and including probe assemblies adapted for testing single microelectronic components and those adapted for testing multiple devices simultaneously, e.g., wafer-level testing. If so desired, the array of pins may be electrically coupled to contacts carried on a backing member which is joined to the substrate.

In one embodiment, the present invention provides a method of manufacturing a microelectronic component probe card. In accordance with this method, a plurality of blind holes are formed to extend inwardly from a front face of a substrate. Each of the holes has a closed bottom spaced from a back face of the substrate by a back thickness. Each of the holes is filled with an electrically conductive metal; the metal in each hole defines a conductor. The back thickness of the substrate is removed, exposing tips of the conductors. A further thickness of the substrate is selectively removed to define an array of pins extending outwardly from a remaining thickness of the substrate, with each pin comprising an exposed length of one of the conductors.

A method in accordance with another embodiment calls for forming a blind hole that extends inwardly from a front face of a substrate. The hole has a closed bottom spaced from a back face of the substrate by a back thickness. The hole is substantially filled with a conductive material. The back thickness of the substrate is removed, exposing a tip of the conductive material. A further thickness of the substrate may then be removed to expose a length of the conductive material that has a surface adapted to establish temporary electrical contact with a contact on a microelectronic component.

An alternative embodiment of the invention provides a method of manufacture in which an array of blind holes is formed to extend inwardly from a front face of a substrate. Each hole has a closed bottom spaced by a back thickness from a back face of the substrate. An intermediate layer may be deposited on an internal surface of at least some of the holes. An electrically conductive metal is deposited on the substrate. The metal fills each of the holes and defines an overburden on the front face; the metal in each hole defines a conductor. At least a portion of the overburden is removed to electrically isolate each of the conductors from one another. A portion of the substrate extending forwardly from the back face is removed to define an array of pins extending outwardly from a remaining thickness of the substrate. Each pin comprises an exposed length of one of the conductors. If so desired, a backing member may be joined with the substrate and the array of pins may be electrically coupled to contacts carried by the backing member.

Still another embodiment of the invention provides a microelectronic component testing system. This testing system includes a substrate having a front face, a back face, and a plurality of openings extending from the front face to the back face in an array. The substrate carries an intermediate layer on an inner surface of each opening. The test system also includes an array of electrically isolated conductors patterned from an integral metal layer. Each conductor has a contact end adjacent the front surface of the substrate, an intermediate length received in one of the openings in the substrate, and an exposed length extending outwardly beyond the back surface of the substrate a distance of no more than 200 microns. A backing member is joined to the substrate and has a confronting surface oriented toward the substrate front surface. The confronting surface of the backing member carries a plurality of electrical contacts, each of which is electrically coupled to the contact end of one of the conductors. This testing system may also include a controller and a power supply, with the controller being operatively connected to the backing member to monitor test performance of a single microelectronic component or multiple microelectronic components.

For ease of understanding, the following discussion is broken down into two areas of emphasis. The first section explains the context of a test system in which probe cards may be employed. The second section outlines methods of manufacturing probe cards according to several embodiments of the invention.

B. Test Systems

FIG. 1 schematically illustrates a microelectronic component test system 10 that may be used to test a microelectronic component 50. The microelectronic component test system 10 generally includes a probe card 20 that is connected to a controller 30. The probe card 20 includes a plurality of pins 25 that may be positioned to contact electrical contacts 52 on the microelectronic component 50. The probes 25 may be connected to circuitry (schematically illustrated in dashed lines 22) in communication with each of the probes and adapted to deliver and/or receive test power (including test signals) to one or more of the probes 25.

The controller 30 may communicate with the circuitry 22 of the probe card 20 by a communication line 34. The controller 30 may take any of a variety of forms. In one embodiment, the controller 30 comprises a computer having a programmable processor 32. The controller 30 may be operatively coupled to a power supply 36 and control delivery of power from the power supply 36 to various components of the probe card 20 via communication line 34. In one embodiment, a single power supply 36 is used to deliver test power to the probes 25. It should be understood, though, that two or more separate power supplies might be used.

As explained more fully below, some embodiments of the invention provide methods for manufacturing probe cards that include arrays of pins arranged in an array which corresponds to an array of electrical contacts 52 carried by the microelectronic component 50. It should be understood that the probe cards made in accordance with the methods outlined below may, but need not, be used in a test system 10 such as that illustrated in FIG. 1. In particular, the probe cards made in accordance with the present invention may be suitable for other applications where the pins are permanently coupled to elements of another microelectronic component.

C. Probe Cards

Figure 2:
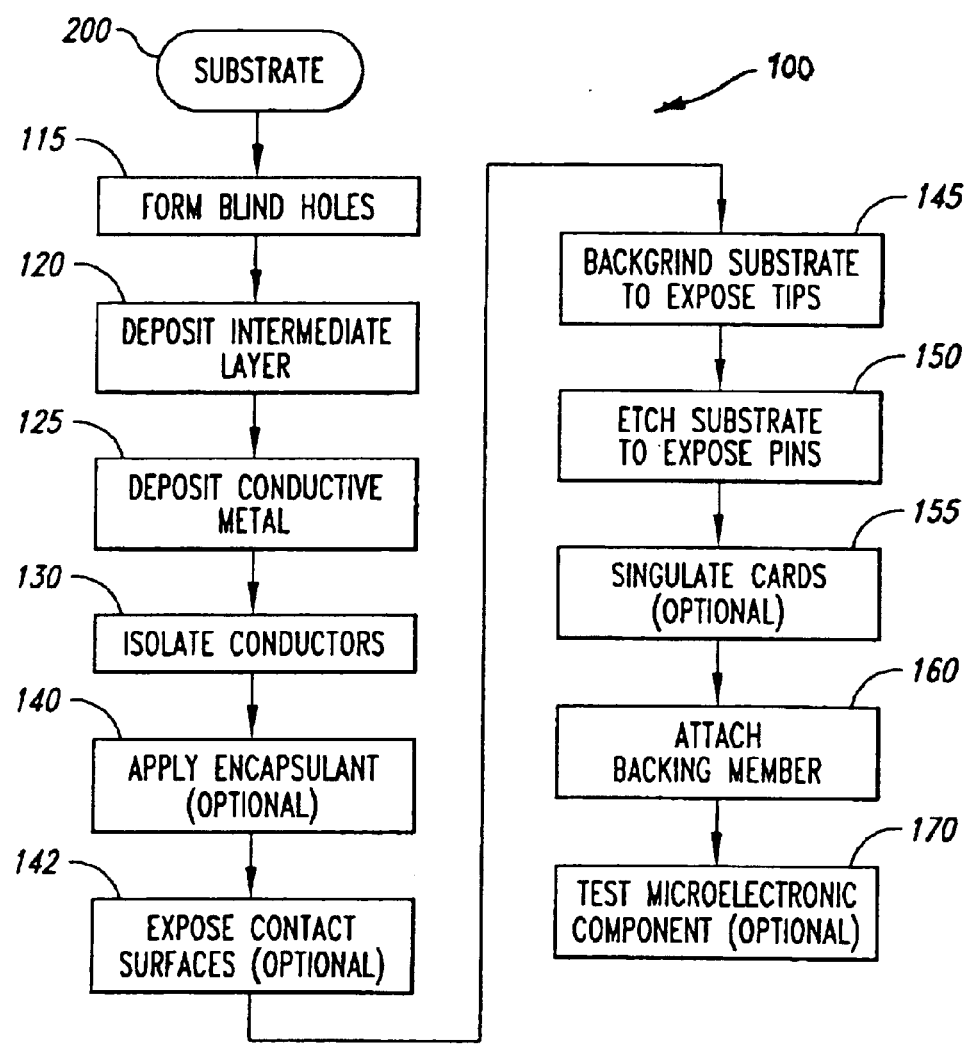
FIG. 2 is a flowchart schematically illustrating a method in accordance with another embodiment of the invention.
Figure 3A:
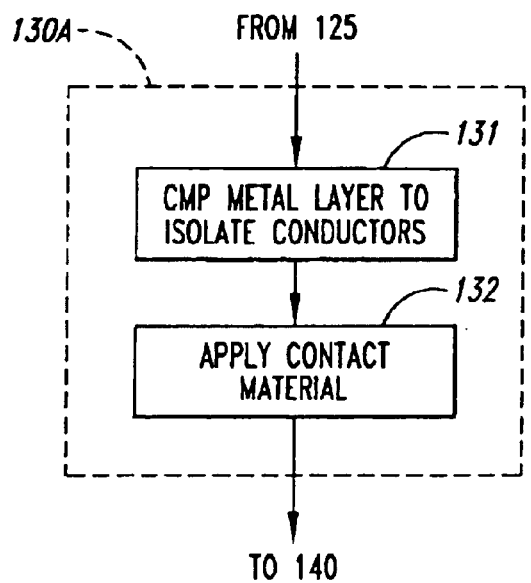
FIGS. 3A and 3B are flowcharts schematically illustrating alternative subprocesses for use in connection with the method outlined in FIG. 2.
Figure 3B:
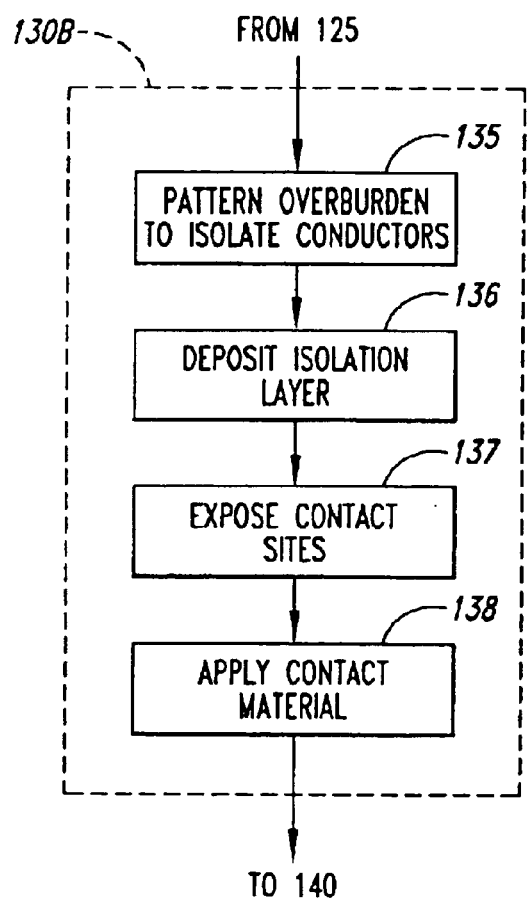
Figure 4:
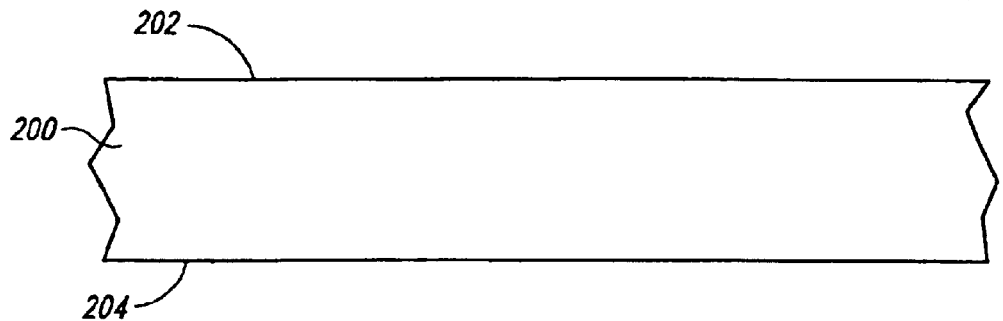
FIGS. 4–9, 10A and 10B, 11A and 11b and 12–16 schematically illustrate sequential stages in a process of manufacturing a microelectronic probe card in accordance with the method of FIG. 2.

FIGS. 2 and 3 schematically illustrate select embodiments of methods of manufacturing microelectronic component probe cards. FIGS. 4–16 are schematic cross-sectional views of the device as it is manufactured. The method 100 of FIG. 2 starts by providing a substrate 200. As shown in FIG. 4, the substrate 200 generally includes a front face 202 and a back face 204. In one embodiment, the front and back faces 202 and 204 are generally parallel to one another, yielding a planar substrate 200. The substrate 200 may comprise a relatively rigid material that is able to resist buckling, stretching, or other deformation during the manufacturing processes outlined below. Suitable materials for the substrate 200 include ceramic, silicon (e.g., an undoped silicon wafer), glass, glass-filled resins, photosensitive glass, or plastic materials, e.g., plastic composites used in printed circuit boards such as FR-4 PCBs.

Figure 5:
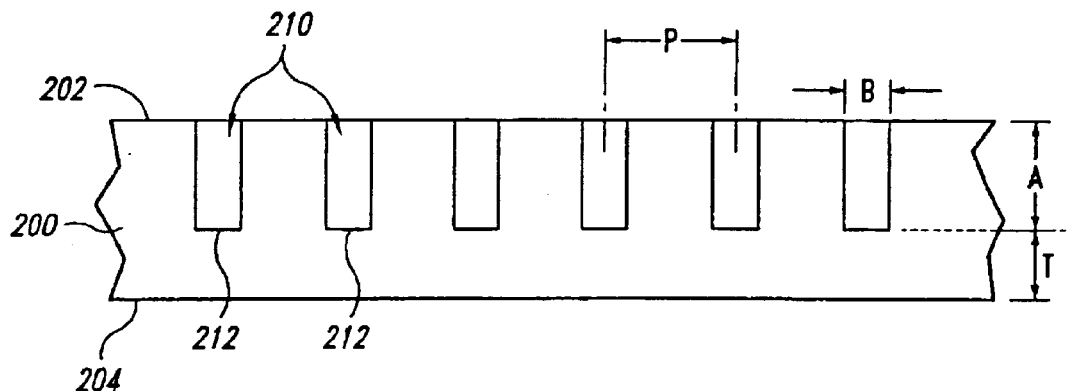

In step 115, blind vias or holes are formed in the substrate. As shown in FIG. 5, these holes extend inwardly from the front face 202 of the substrate to a depth A from the front face 202. Each of these holes 210 is a blind hole, i.e., it has a bottom 212 rather than extending through the entire thickness of the substrate 200. This leaves a back thickness T between the bottom 212 of the hole 210 and the back face 204 of the substrate 200. The holes 210 may be arranged in an array which corresponds to an array of contacts on a particular microelectronic component design to be tested with the probe card.

The holes 210 may be formed in a variety of different fashions, with the optimal method depending, at least in part, on the nature of the substrate 200. The forming process should permit forming the array of holes 210 with the requisite pitch P. For example, some ceramic, silicon, and photosensitive glass substrates can be patterned using a photolithographic process and etched with a wet etchant or the like to form the holes 210. Photosensitive glass materials are commercially available from Schott Corporation of Yonkers, N.Y., USA under the trade name FOTURAN. Depending on the nature of the substrate material and the necessary tolerances for any given application, the holes 210 can also be mechanically machined or laser machined, e.g., via laser ablation. In an alternative embodiment, the holes 210 are molded integrally with the substrate rather than being formed in the separate process in step 115.

The depth A, diameter B (which may be a lateral dimension for non-circular holes 210) and pitch P of the holes 210 may be varied to meet the needs of any specific application. In one embodiment, the holes 210 have a depth A of at least about 50 $\mu$m. In another embodiment, the depth A is at least about 200 $\mu$m. The diameter B of each of the holes 210 will depend, at least in part, on the pitch P between the holes 210. Generally, holes 210 having larger diameters will yield pins (discussed below) having a lower resistance, which can improve performance of the test system 10. A sufficient distance should be left between each of the holes 210 to reduce any electrical cross-talk or capacitance issues in the final probe card. In one embodiment, the diameter of each of the holes 210 is at least 20 $\mu$m. A diameter B of about 10–60 $\mu$m is expected to suffice for most fine-pitch testing applications. For applications with larger pitch P, the diameter B may be 60 $\mu$m or greater. A diameter of about 60–200 $\mu$m is considered adequate for most larger-pitch applications.

Figure 6:
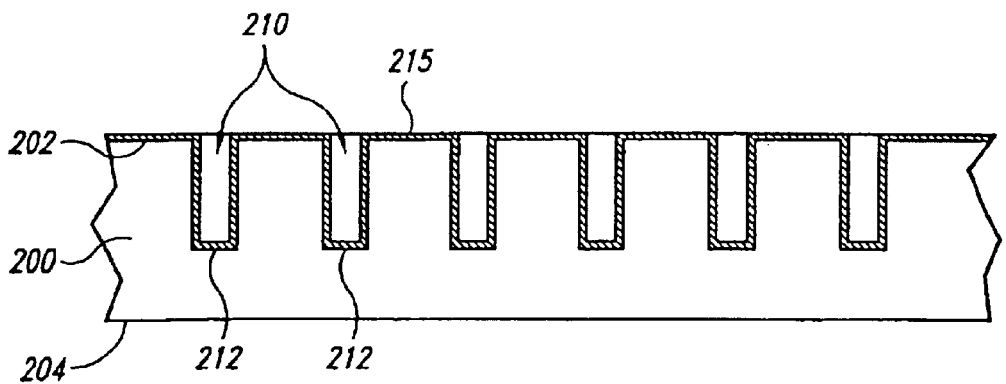

Turning back to FIG. 2, after the holes are formed in step 115, an intermediate layer may be deposited on the substrate 200 in step 120. FIG. 6 schematically illustrates the substrate 200 with an intermediate layer 215 deposited thereon. In particular, the intermediate layer 215 may substantially cover the front face 202 of the substrate and an internal surface of each of the holes 210.

Materials useful as the intermediate layer 215 will depend, at least in part, on the nature of the substrate 200 and the nature of the conductive material used in subsequent steps to fill the holes 210. In one embodiment, the intermediate layer 215 provides a measure of electrical insulation between the conductor material later filled in the holes 210. This can be useful if the substrate 200 comprises a semiconductor, for example, but likely will be unnecessary if the substrate 200 is formed of an electrically insulative material. The intermediate layer 215 may also be selected to promote adherence of the substrate 200 to the conductive material used to fill the holes 210. In some circumstances, the intermediate layer 215 may serve as a chemical barrier to limit interaction of the material filling the holes 210 with the material of the substrate 200. For some applications, suitable materials for the intermediate layer 215 include metals (e.g., hard conductive metals such as nickel or chrome) and non-metallic material such as thermally enhanced silicon oxide (TEOS), silicon nitride, titanium nitride, a combination of TEOS and silicon and/or titanium nitrides, a polyamide (e.g., CRC 7561 from Sumitomo), and Parylene (a highly conformal coating commercially available from a number of suppliers, including Advanced Coating of Rancho Cucamonga, Calif., USA). The material of the intermediate layer 215 will dictate the most effective process of applying the intermediate layer 215 to the substrate 200, but these processes may include chemical vapor deposition (CVD), physical vapor deposition (PVD), electroless deposition, and electrolytic deposition.

The intermediate layer 215 may provide a variety of benefits, as noted above, depending on the particular materials selected. In some circumstances, though, the intermediate layer will not be necessary and the intermediate layer deposition step 120 may be omitted from the method 100.

Figure 7:
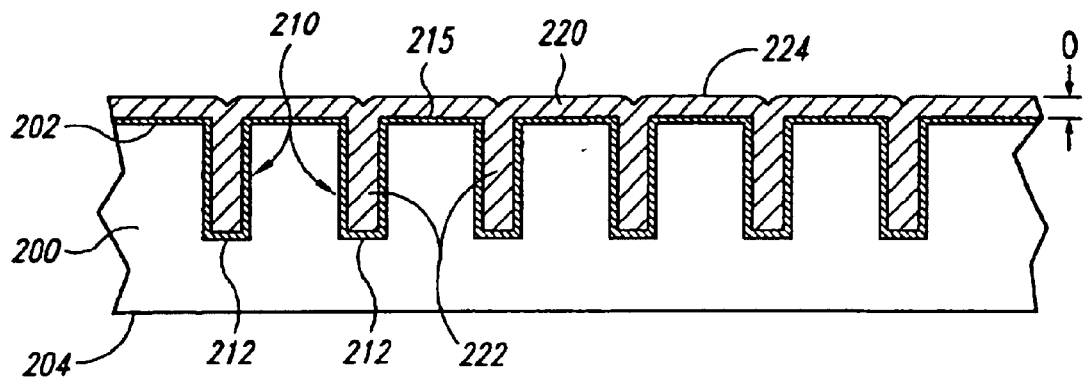

The next step 125 in the method 100 outlined in FIG. 2 comprises depositing a conductive metal or other suitable conductive material. As shown in FIG. 7, the conductive metal 220 may substantially fill each of the holes 210, defining a conductor 222 in each of the holes 210. An excess of the conductive metal 220 may be deposited on the exterior of the intermediate layer 215. This excess conductive metal 220 may define an overburden O which extends across the front face of the intermediate layer 215 and electrically connects each of the conductors 222 to one another.

Although any suitably conductive material may be used, the conductive material 220 desirably comprises a conductive metal, e.g., aluminum, copper, nickel, gold, beryllium-copper, or alloys of aluminum, copper, nickel, gold, or beryllium. The conductive metal 220 may be applied in a variety of conventional processes, including CVD, PVD, electroless deposition, and electrolytic deposition.

Figure 8:
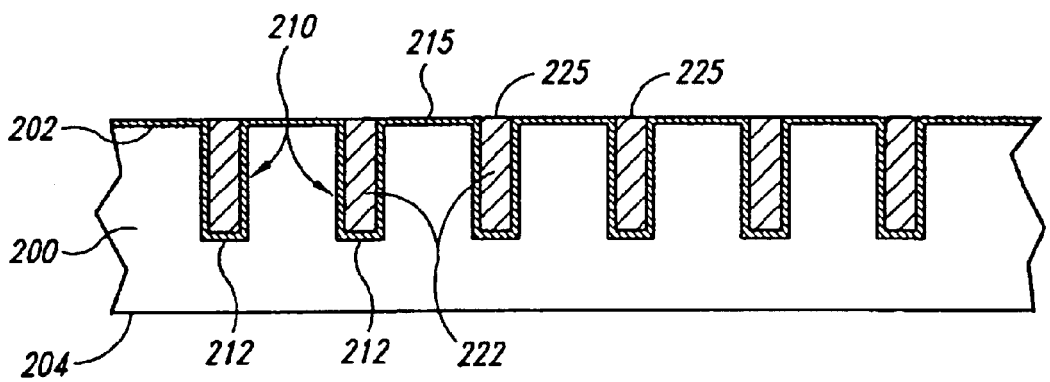

The overburden O of conductive metal 220 electrically connects each of the conductors 222 to one another. This would interfere with effective operation of the test system 10 shown in FIG. 1. Consequently, the method 100 includes a step 130 of isolating the conductors 222. The connectors may be isolated in a variety of different fashions; FIGS. 3A and 3B illustrate two alternative isolation subprocesses 130A and 130B, respectively. In the isolation subprocess 130A, the entire overburden O is removed in step 131, e.g., by polishing the exterior 224 of the conductive metal 220. This may be done using conventional mechanical planarization or chemical-mechanical planarization processes (collectively referred to as "CMP" processes). CMP processes are well known in the art and need not be detailed here. Briefly, though, CMP processes involve abrading the exterior surface 224 of the metal layer 220 using an abrasive medium. This abrasive medium may be carried by a planarizing pad and the substrate 200 may be urged toward the planarizing pad with a controlled force until the desired thickness of material has been removed. As shown in FIG. 8, this removal process 131 may be continued until the entire overburden O has been removed. If the intermediate layer 215 is electrically insulative, the intermediate layer may be left intact, as shown. If the intermediate layer 215 is too conductive, though, the removal process 131 may be continued until the underlying front face 202 of the substrate 200 is once again exposed.

Figure 9:
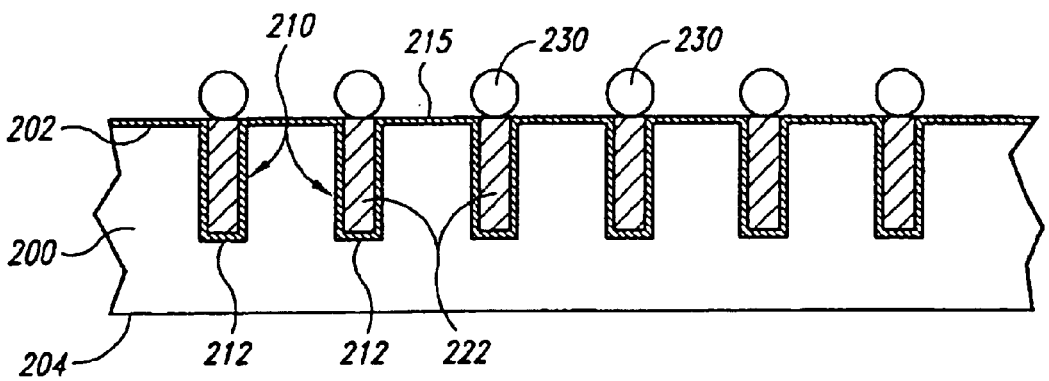

To facilitate an independent electrical connection of the conductors 222 to a backing member or the like, as discussed below, a separate contact material may be applied to an exposed surface 225 of each of the conductors 222 (step 132 in FIG. 3A). In FIG. 9, this contact material is typified as a solder ball 230, but other suitable contact materials may be employed. For example, a suitable electrically conductive solder or epoxy may be stenciled or screen printed on the substrate 200 to deposit a quantity of electrically conductive contact material atop the outer surface (225 in FIG. 8) of each of the conductors 222. This will provide a series of electrically independent conductors 222 with an electrical bridge (e.g., a solder ball 230) extending outwardly beyond the front face 202 or the intermediate layer 215.

Figure 10A:
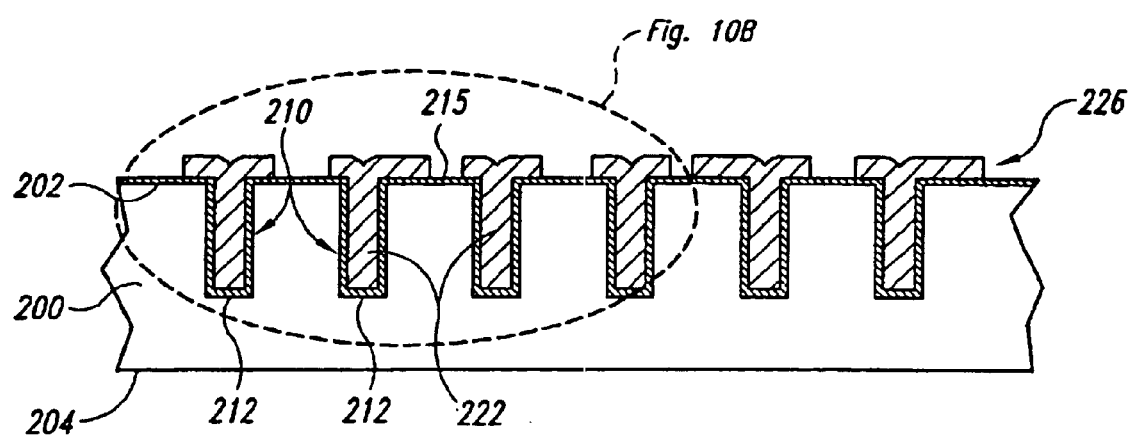
Figure 10B:
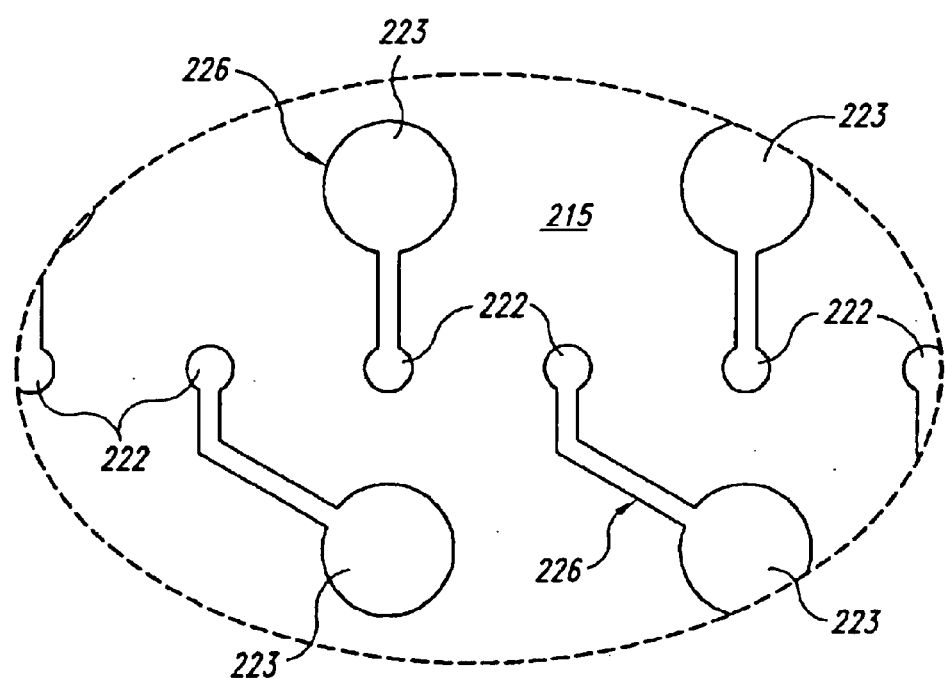

FIG. 3B illustrates an alternative embodiment of the conductor isolation step 130 of the method 100. In this embodiment, the isolation subprocess 130B starts by patterning the overburden O (FIG. 7) in step 135. As schematically illustrated in FIG. 10A, patterning the overburden O may comprise removing a portion of the overburden O to expose a portion of the intermediate layer 215 and leave a patterned overburden 226. This patterning may be accomplished using conventional techniques, e.g., coating with a photoresist, exposure to radiation, selective etching, then removal of remaining photoresist. In one embodiment, the connectors 222 are electrically isolated from one another by forming electrically separate islands, each of which is localized adjacent its associated conductor 222. In an alternative embodiment, the patterned overburden 226 defines electrical circuitry on the surface of the substrate 200. As shown in FIG. 10B, the patterned overburden 226 may function as an integrated redistribution layer, providing a plurality of new contact pads 223 for electrically coupling the connectors 222 to a backing member or the like (as noted below). These contact pads 223 may be spaced farther from one another than are the conductors 212.

The next operation in the subprocess 130 illustrated in FIG. 3B comprises depositing an isolation layer (step 136). As shown schematically in FIGS. 11A–B, the isolation layer 234 may substantially cover the portions of the intermediate layer 215 exposed when patterning the overburden O (step 135). The isolation layer 234 may also extend over the remaining portions of the patterned overburden 226. The isolation layer 234 may be formed of any suitable electrically insulative material. In one embodiment, the isolation layer 234 comprises a curable polymeric resin. In certain select embodiments, the isolation layer 234 may comprise Parylene, a photoimagable polymer, a low-temperature spun-on glass (SOG) material, or a solder mask material.

Figure 11A:
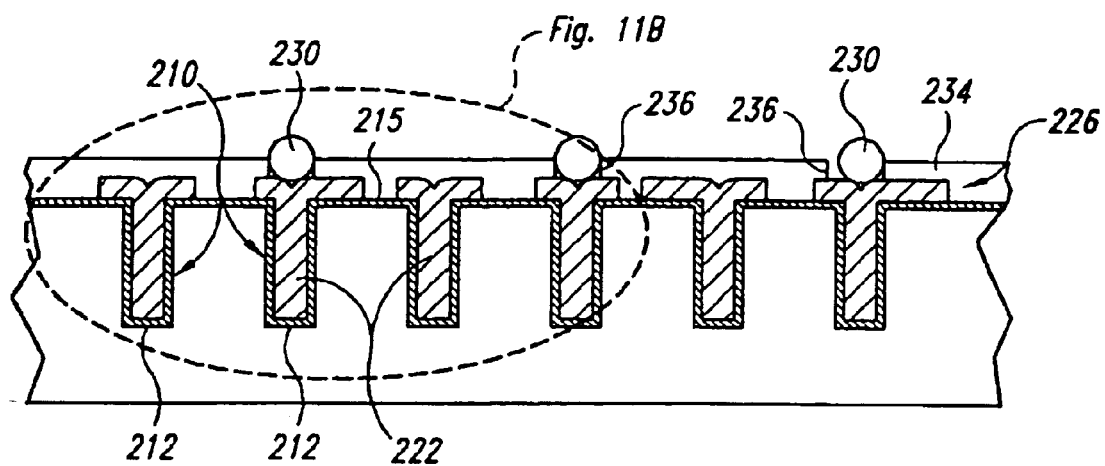

After the isolation layer 234 is applied, portions of the contact pads 223 may be selectively exposed in step 137. As shown in FIG. 11A, this may be accomplished by forming openings 236 in the isolation layer 234. In one embodiment, one opening 236 may be positioned directly above each of the conductors 222. In the embodiment illustrated in FIGS. 11A and 11B, each of the conductors 222 is associated with a different contact pad 223. A separate opening 236 in the isolation layer 234 may be provided for each of these contact pads 223. If so desired, this process may be repeated to form multiple layers of circuitry, with each layer being formed by applying a metal layer over the existing surface (including the pad surface exposed by the opening 236), patterning the metal layer, applying an isolation layer, and forming contact openings at various locations.

Figure 11B:
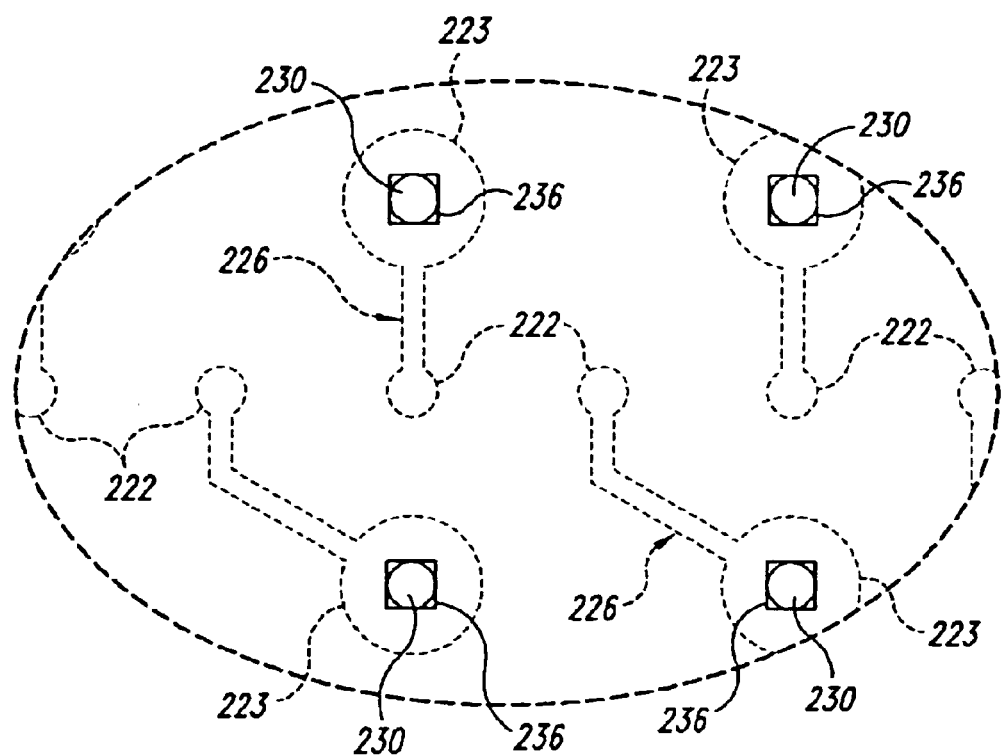

The next step in the conductor isolation subprocess 130B is applying contact material to the exposed contact sites in step 138. In FIGS. 11A–B, this contact material is typified as a solder ball 230. As discussed above in connection with step 132 and FIG. 9, though, a variety of other conductive materials may be used instead of solder balls. As suggested in FIGS. 12 and 13, in one embodiment, the solder balls 230 are optionally encapsulated in an encapsulant (step 140) and this encapsulant is ground or otherwise reduced to reexpose the solder balls 230 (step 142).

Figure 12:
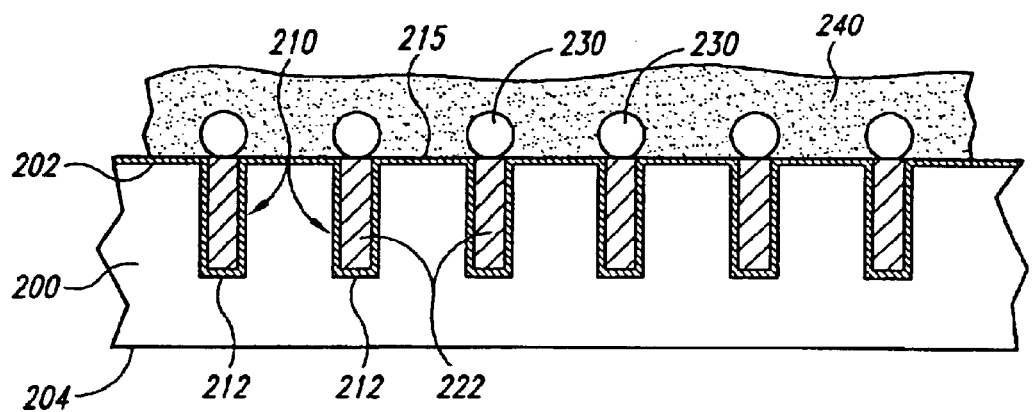
Figure 13:
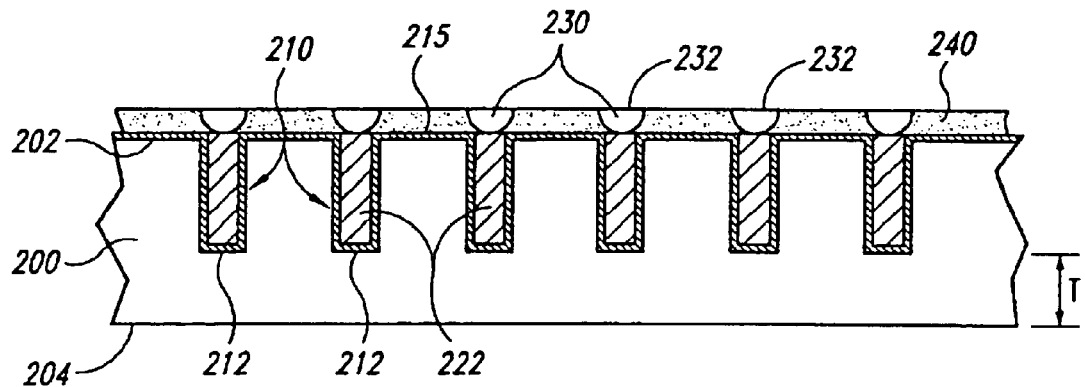

FIG. 12 schematically illustrates the application of the encapsulant in step 140 and FIG. 13 schematically illustrates reexposing the contact material in step 142. As suggested in FIG. 12, an excess of an encapsulant material 240 may be applied over the exposed surface of the intermediate layer 215 and all of the solder balls 230. In the illustrated embodiment, the encapsulant 240 extends outwardly from the substrate 200 a distance which exceeds the height of the solder balls 230. In another embodiment, less encapsulant 240 is used and minor portions of some or all of the solder balls 230 may extend outwardly beyond the encapsulant 240. Any of a wide variety of materials may be used as the encapsulant. In one embodiment, the encapsulant is electrically insulative to promote electrical isolation of the conductors 222 from one another. If so desired, the encapsulant 240 may be selected from the same materials discussed above in connection with the isolation layer 234 in FIGS. 11A–B, e.g., materials such as Parylene, or a low-temperature SOG coating, a glob-top type material, thermoplastic overmolded material, and/or thermosetting overmolded material.

In FIG. 13, the encapsulant 240 and a portion of each of the solder balls 230 has been ground away, e.g., by conventional CMP processes (including both mechanical and chemical-mechanical planarizing processes), reexposing the solder balls 230. In one embodiment, the encapsulant 240 and the solder balls 230 are ground down to about half the height of the solder balls, leaving an exposed contact face 232 of each of the solder balls substantially flush with a face of the encapsulant 240.

The next two steps 145 and 150 of the method 100 remove a portion of the substrate 200 to expose a length of each of the conductors 222. This may be accomplished in a variety of ways. In one embodiment, the lengths of the conductors 222 are exposed in a single one-step process. In the embodiment shown in FIG. 2, the substrate 202 first subjected to a backgrind operation to expose the tips of the conductors 222 (step 145) and the substrate is then selectively etched to expose lengths of the conductors 222 (step 150). For at least some substrate materials, this two-stage process can increase throughput because the backgrind operation may remove material relatively rapidly, but not selectively, while the selective etch may remove material of the substrate more slowly but leave the conductors 222 intact.

Figure 14:
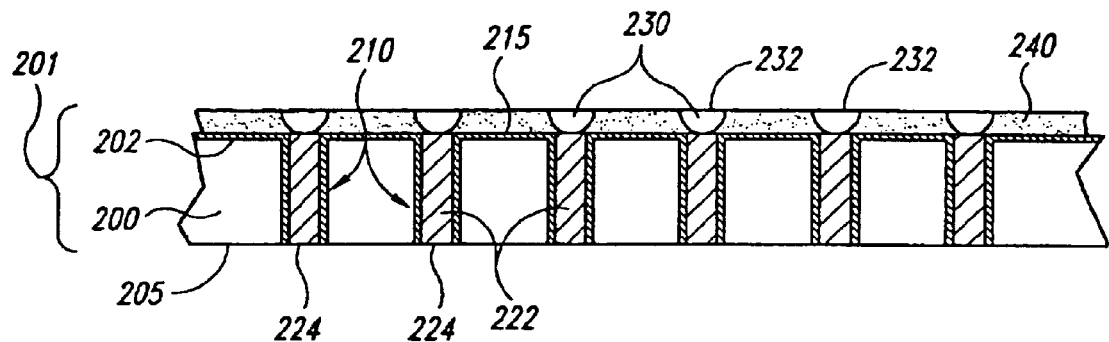

FIG. 14 schematically illustrates a reduced thickness assembly 201 resulting from the backgrind operation in step 145. In the assembly 201, the back thickness (T in FIG. 13, for example) has been removed. An additional thickness of the substrate 200 of FIG. 13 has also been removed, grinding away the thickness of the intermediate layer 215 at the bottom 212 of each of the holes 210. If the intermediate layer 215 is electrically insulative, this will expose an electrically conductive tip 224 of each of the conductors 222. If the intermediate layer 215 is electrically conductive, the backgrind operation 145 may be terminated when the intermediate layer 215 at the bottom 212 of the holes 210 has been exposed. In either approach, the exposed tip 224 of the conductor (either with out without the intermediate layer 215) may be substantially flush with a ground back face 205 of the substrate.

Figure 15:
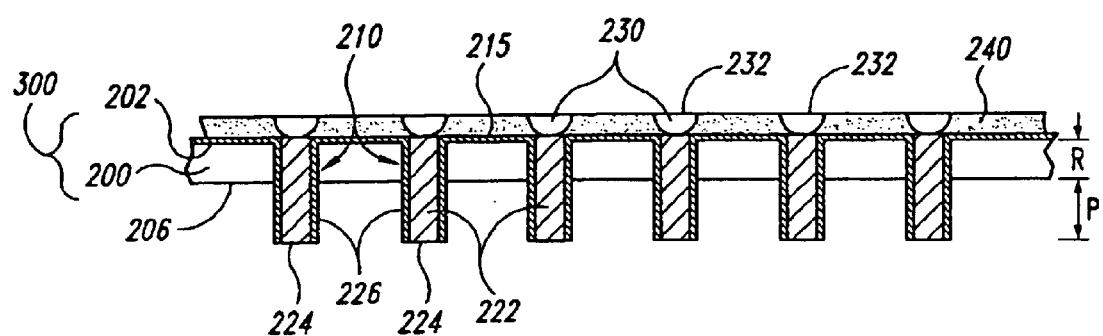
Figure 16:
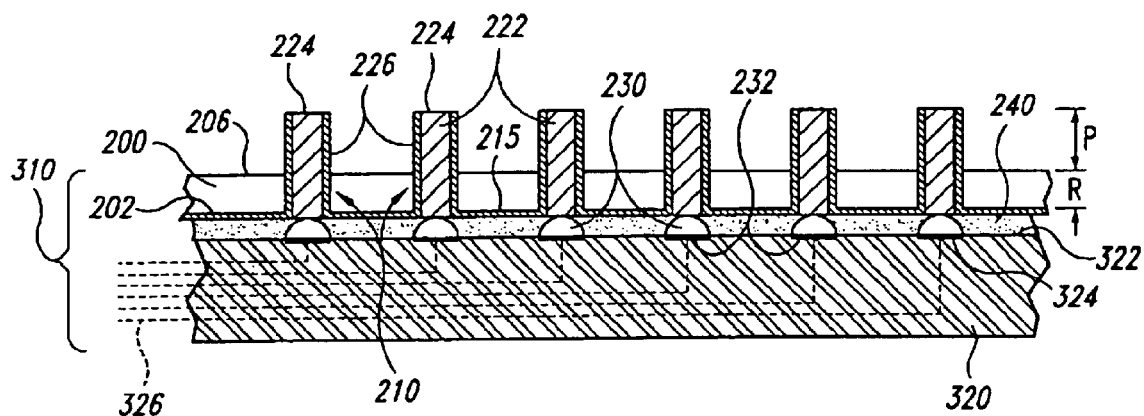

FIG. 15 schematically illustrates the assembly 300 which results from the substrate etch process in step 150. At this stage, the substrate 200 has been etched back so that only a remaining thickness R of the substrate 200 remains. An exposed pin length P of each of the conductors 222 extends outwardly beyond the etched face 206 of the substrate. The exposed pin length of the conductors 222 comprise electrically conductive pins 226. Each of the pins 226 has a surface 224 which is adapted to establish temporary electrical contact with a contact on a microelectronic component (50 in FIG. 1).

In the embodiment of FIG. 15, the substrate has been selectively etched, leaving both the intermediate layer 215 and the conductor 222. In an alternative embodiment, the etchant may also etch the intermediate layer 215, leaving only the conductor 222. This can be advantageous in some circumstances where the intermediate layer 215 is electrically insulative. In another embodiment, the intermediate layer 215 and/or exposed conductor 222 may be coated with a hard or wear-resistant material, e.g., an electroless nickel or chrome plating layer (not shown). This may enhance durability if the pins 226 are formed of a softer metal, e.g., aluminum or copper.

In some embodiments, the size of the substrate is selected to correspond to the dimensions of the desired probe card (20 in FIG. 1). In another embodiment, a number of probe cards may be produced simultaneously on a single larger substrate. After the steps 115–150 of the method 100, the large substrate 200 may be cut or "singulated" into a number of separate probe cards (step 155). If the substrate 200 comprises a semiconductor wafer, for example, this may be accomplished by applying a backing tape on the exposed surface of the encapsulant 240 and dicing the remaining thickness R of the substrate and the encapsulant 240 with a wafer saw, as is known in the art.

In one embodiment, the probe card assembly 300 shown in FIG. 15 may be electrically coupled to a controller 30 and used in the test system 10 to test microelectronic components 50. If the assembly 300 is to be used as the test card 20, the remaining thickness R of the substrate and the encapsulant 40 should be strong enough to avoid buckling and deformation of the assembly 300 during a test operation. This will help ensure that the array of pins 226 remains aligned with a corresponding array of contacts 52 on the microelectronic component 50.

In the method of FIG. 2, though, the assembly 300 is attached to a backing member 320 (step 160) to yield a probe card 310. The backing member 320 includes a confronting face 322 carrying a plurality of electrical contacts 324. The electrical contacts 324 are arranged in an array which corresponds to the array of contact surfaces 232 of the subassembly 300. This array of electrical contacts 324 is electrically coupled to the array of contact surfaces 232 on the subassembly 300. This electrical coupling may be carried out using any conventional process for electrical coupling microelectronic components to one another, e.g., using flip-chip techniques wherein a solder ball, solder paste, or other electrically conductive adhesive (not shown) joins the contact surfaces 232 to the electrical contacts 324. Alternatively, the assembly 300 may be joined to the backing member 320 by a polymeric film which conducts electricity anisotropically in a z-axis; such films are commercially available.

The backing member 320 may be rigid or flexible. In one embodiment, the backing member 320 comprises a printed circuit board, e.g., an FR-4 PCB. Suitable materials for a rigid backing member 320 include ceramic, silicon, glass, glass-filled resins, and rigid plastic materials.

In another embodiment, the backing member 320 is flexible. Suitable flexible backing members 320 may be formed of polyamide film or other films commonly used in flexible electronic substrates. In one embodiment, the flexible backing member 320 comprises a KAPTON tape which includes a polyamide film on which a layer of copper or the like has been sputtered and etched to form suitable electrical circuitry 326. In another embodiment, the backing member 320 comprises a conventional lead frame which is partially encapsulated in a flexible or rigid encapsulant. This can facilitate connection of the solder balls 230 and, hence, the conductors 222 to a processor or other integrated circuit carried by backing member 320.

In one embodiment, the substrate 200 in the probe card 310 is formed of a relatively rigid material and the backing member 320 is flexible. In another embodiment, the substrate 200 is formed of a flexible material, as well, yielding a flexible probe card 310. Such a flexible probe card 310 may be useful in a variety of applications in addition to use as a test probe card. In another embodiment, the substrate 200 is formed of a rigid material to facilitate manufacturing the assembly 300. After the assembly 300 is joined to the flexible backing member 320, the entirety of the substrate 200 may be etched away, leaving the entire length of the conductors 222 exposed as pins. If deemed beneficial to provide surface support or electrical isolation, for example, a flexible polymeric material or the like may be deposited between the conductors 222, effectively taking the place of a portion of the previous rigid substrate 200.

In one embodiment, the probe card 310 (or the assembly 300) may be used as a probe card 20 in a testing system 10 such as that shown in FIG. 1 to test the microelectronic component 50 (step 170). The probe card 310 may be electrically connected to the controller 30 of the test system 10 by the electrical circuitry 326 in the backing member 320. The array of pins of the probe card 310 may be brought into temporary electrical contact with a mating array of contacts 52 carried by the microelectronic component 50. A test signal may be delivered to the microelectronic component 50 with at least one of the pins of the probe card 310 and performance of the microelectronic component 50 may be monitored in a conventional fashion.

In one embodiment, the substrate 200 of the probe card 310 is formed of a material similar to the bulk of the microelectronic component 50. In one specific example useful for burn-in testing of silicon-based semiconductor wafers, dies, or packages, the substrate 200 of the probe card 310 is formed of silicon, e.g., from a wafer of undoped silicon. Since the body of the microelectronic component 50 and the substrate 200 of the probe card 310 (or the assembly 300) are both formed of silicon, their coefficients of thermal expansion will be fairly closely matched. As a consequence, the probe card 310 can compensate for temperature variations over a relatively large range of test temperatures.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. Aspects of the invention may also be useful in other applications, e.g., forming permanent connections to microelectronic components. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A microelectronic component testing system, comprising:
   a substrate having a front face, a back face, and a plurality of openings extending from the front face to the back face in an array;
   an array of electrically isolated conductors patterned from an integral metal layer, each conductor having a contact end adjacent the front surface of the substrate, an intermediate length received in one of the openings in the substrate, and an exposed length extending outwardly beyond the back surface of the substrate a distance of no more than 200 microns; and
   a backing member joined to the substrate and having a confronting surface oriented toward the substrate front surface, the confronting surface carrying a plurality of electrical contacts, each of which is electrically coupled to the contact end of one of the conductors.

2. The microelectronic component testing system of claim 1 wherein the substrate comprises undoped silicon.

3. The microelectronic component testing system of claim 1 wherein each of the conductors has a diameter no greater than 200 microns.

4. The microelectronic component testing system of claim 1 wherein each of the conductors has a diameter no greater than 60 microns.

5. The microelectronic component testing system of claim 1 wherein each of the conductors has a diameter of about 10–60 microns.

6. The microelectronic component testing system of claim 1 wherein the backing member comprises a flexible tape.

7. The microelectronic component testing system of claim 1 wherein the backing member comprises a printed circuit board.

8. The microelectronic component testing system of claim 1 further comprising a controller and a power supply, the controller being operatively connected to the backing member to monitor test performance of a microelectronic component.

9. The microelectronic component testing system of claim 1 further comprising an intermediate layer disposed between an inner surface of one of the openings in the substrate and the conductor received in that opening.

10. The microelectronic component testing system of claim 9 wherein the intermediate layer provides electrical insulation between the substrate and the conductor received in that opening.

11. The microelectronic component testing system of claim 9 wherein the intermediate layer extends across at least a portion of the front face of the substrate.

12. A microelectronic component testing system comprising:
- a probe card including:
  - a substrate having a front face, a back face, and a plurality of openings extending from the front face to the back face in an array;
    - an array of electrically isolated conductors patterned from an integral metal layer, at least one of the conductors having a contact end adjacent the front surface of the substrate, an intermediate length received in one of the openings in the substrate, and an exposed length extending outwardly beyond the back surface of the substrate a distance of no more than 200 microns; and
    - a backing member joined to the substrate and carrying a plurality of electrical contacts, at least one of which is electrically coupled to the contact end of the at least one conductor;
- a power supply; and
- a controller in communication with the probe card and the power supply, the controller being configured to monitor test performance of a microelectronic component.

13. The microelectronic component testing system of claim 12 wherein the substrate comprises undoped silicon.

14. The microelectronic component testing system of claim 12 wherein the at least one conductor has a diameter no greater than 200 microns.

15. The microelectronic component testing system of claim 12 wherein the at least one conductor has a diameter no greater than 60 microns.

16. The microelectronic component testing system of claim 12 wherein each of the conductors has a diameter of about 10–60 microns.

17. The microelectronic component testing system of claim 12 wherein the backing member comprises a flexible tape.

18. The microelectronic component testing system of claim 12 wherein the backing member comprises a printed circuit board.

19. The microelectronic component testing system of claim 12 further comprising a controller and a power supply, the controller being operatively connected to the backing member to monitor test performance of a microelectronic component.

* * * * *